(12) United States Patent
Li

(10) Patent No.: US 11,791,364 B2
(45) Date of Patent: Oct. 17, 2023

(54) ELECTRONIC COMPOUND EYE IMAGING DEVICE

(71) Applicant: BOE TECHNOLOGY GROUP CO., LTD., Beijing (CN)

(72) Inventor: Yingyi Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 13 days.

(21) Appl. No.: 16/475,781

(22) PCT Filed: Jan. 29, 2019

(86) PCT No.: PCT/CN2019/073704
§ 371 (c)(1),
(2) Date: Jul. 3, 2019

(87) PCT Pub. No.: WO2019/227961
PCT Pub. Date: Dec. 5, 2019

(65) Prior Publication Data
US 2021/0358991 A1     Nov. 18, 2021

(30) Foreign Application Priority Data
Jun. 1, 2018   (CN) .................. 201810558990.9

(51) Int. Cl.
*H01L 27/146* (2006.01)
*H01L 31/103* (2006.01)
*H01L 31/105* (2006.01)

(52) U.S. Cl.
CPC .. *H01L 27/14643* (2013.01); *H01L 27/14627* (2013.01); *H01L 27/14636* (2013.01);
(Continued)

(58) Field of Classification Search
CPC .................................. H01L 27/14643–14663
See application file for complete search history.

(56) References Cited

U.S. PATENT DOCUMENTS

2007/0040166 A1* 2/2007 Kaluzhny ......... H01L 27/14627
257/40
2009/0267230 A1 10/2009 Hwan
(Continued)

FOREIGN PATENT DOCUMENTS

CN        102222665 A     10/2011
CN        103887316 A      6/2014
(Continued)

OTHER PUBLICATIONS

Y. M. Song and H. G. Park, "Recent advances on optoelectronic devices inspired by the compound eyes," 2015 International Conference on Optical MEMS and Nanophotonics (OMN), 2015, pp. 1-2, doi: 10.1109/OMN.2015.7288901 (Year: 2015).*
(Continued)

*Primary Examiner* — Kevin Parendo

(57) ABSTRACT

The disclosure provides an electronic imaging device and a manufacturing method thereof, a flexible electronic compound eye and a manufacturing method thereof. The electronic imaging device includes a base substrate and a plurality of photosensitive units arranged in an array on a surface of the base substrate, at least one of the photosensitive units includes a photodiode and a rectifier diode connected in series. The photodiode includes a first conduction type doped region and a second conduction type doped region, the rectifier diode includes a first conduction type doped region and a second conduction type doped region, and the first conduction type doped region of the photodiode and the first conduction type doped region of the rectifier diode are electrically connected to each other.

16 Claims, 9 Drawing Sheets

(52) U.S. Cl.
CPC ...... *H01L 27/14685* (2013.01); *H01L 31/103* (2013.01); *H01L 31/105* (2013.01)

(56) References Cited

U.S. PATENT DOCUMENTS

| | | | | |
|---|---|---|---|---|
| 2010/0006746 A1* | 1/2010 | Hirose | ................ | G01N 21/255 |
| | | | | 250/208.2 |
| 2011/0115054 A1* | 5/2011 | Cheng | ............... | H01L 29/66234 |
| | | | | 257/E29.174 |
| 2012/0256304 A1* | 10/2012 | Kaigawa | ........... | H01L 27/14645 |
| | | | | 257/656 |
| 2013/0009125 A1* | 1/2013 | Park | .................... | H01L 29/8613 |
| | | | | 257/532 |
| 2016/0134952 A1 | 5/2016 | Svilans | | |
| 2018/0019038 A1* | 1/2018 | Tsuchiya | ................. | H01B 1/22 |

FOREIGN PATENT DOCUMENTS

| | | |
|---|---|---|
| CN | 104124256 A | 10/2014 |
| CN | 107113079 A | 8/2017 |
| CN | 108550598 A | 9/2018 |

OTHER PUBLICATIONS

International Search Report and Written Opinon dated Mar. 15, 2019; PCT/CN2019/073704.

\* cited by examiner

| forming a plurality of photosensitive units 200 on a predetermined substrate in an array, the photosensitive unit 200 can include a photodiode 201 and a rectifier diode 202 connected in series, and the photodiode 201 and the rectifier diode 202 share a same first conductive type doped region 20a such as a p-doped region | ← S10 |

↓

| forming a flexible base substrate, i.e., a base substrate 20 of a flexible material on a predetermined substrate where the photosensitive units 200 are formed, and stripping off the predetermined substrate after forming the flexible base | ← S20 |

↓

| forming prepolymers 600 in a groove 500 of a lens template 50, attaching the photosensitive units 200 having the flexible base substrate to a surface of the lens template 50 to allow a position of the photosensitive unit 200 to cossrespond to that of the groove 500 | ← S30 |

↓

| controlling the prepolymers 600 to undergo polymerization to obtain a polymer lens 60, and performing a demolding process after the polymer lens 60 is formed, the flexible base substrate and the polymer lens 60 are respectively located on both sides of the photosensitive unit 200 | ← S40 |

FIG. 21

ELECTRONIC COMPOUND EYE IMAGING DEVICE

This application claims priority to the Chinese patent application No. 201810558990.9, filed Jun. 1, 2018, the entire disclosure of which is incorporated herein by reference as part of the present application.

TECHNICAL FIELD

Embodiments of the present disclosure relate to an electronic imaging device and a manufacturing method thereof, a flexible electronic compound eye and a manufacturing method thereof.

BACKGROUND

In a traditional electronic imaging device, a photosensitive device is mostly implemented by a complementary metal-oxide semiconductor (CMOS) or a charge coupled device (CCD), but it has a planar structure, so it is necessary to set up a multi-layered complex lens to converge light on a plane to form a planar image.

SUMMARY

Some embodiments of the disclosure provide an electronic imaging device, comprising a base substrate and a plurality of photosensitive units arranged in an array on a surface of the base substrate, each of the photosensitive units comprises a photodiode and a rectifier diode connected in series, wherein the photodiode comprises a first conduction type doped region and a second conduction type doped region, the rectifier diode comprises a first conduction type doped region and a second conduction type doped region, and the first conduction type doped region of the photodiode and the first conduction type doped region of the rectifier diode are electrically connected to each other.

In some examples, the photodiode and the rectifier diode share a same first conduction type doped region.

In some examples, the first conduction type doped region is a p-doped region.

In some examples, the photodiode comprises a PN junction composed of the first conduction type doped region and the second conduction type doped region, a shape of an interface between the first conduction type doped region and the second conduction type doped region comprises at least one selected from the group consisting of a straight line shape, a fold line shape and a curved line shape.

In some examples, the photodiode comprises a PIN junction composed of the first conduction type doped region, the second conduction type doped region and a non-doped region between the first conduction type doped region and the second conduction type doped region, a shape of the non-doped region comprises at least one selected from the group consisting of a straight line shape, a fold line shape and a curved line shape.

In some examples, the fold line shape comprises a fold line wave shape or a square wave shape, and the curved line shape comprises a wave shape or a sinusoidal shape.

In some examples, the electronic imaging device further comprises first signal leads and second signal leads interleaved with each other, the first signal leads are connected to an end of the photodiode away from the rectifier diode, and the second signal leads are connected to an end of the rectifier diode away from the photodiode.

In some examples, the first signal leads are electrically connected to the second conduction type doped region of the photodiode, the second signal leads are electrically connected to the second conduction type doped region of the rectifier diode.

In some examples, the plurality of photosensitive units are arranged in an extension direction of the first signal leads and an extension direction of the second signal leads, to form a plurality of photosensitive unit columns and a plurality of photosensitive unit rows, each of the first signal leads is connected to all the photosensitive units of a corresponding photosensitive unit column, and each of the second signal leads is connected to all the photosensitive units of a corresponding photosensitive unit row.

In some examples, the base substrate is a flexible base substrate.

In some examples, the first signal leads comprise a flexible conductive line, and the second signal leads comprise a flexible conductive line.

In some examples, the first signal leads comprise a spring-shaped conductive line or a nano-silver conductive line, the second signal leads comprise a spring-shaped conductive line or a nano-silver paste conductive line.

Some embodiments of the disclosure provide a flexible electronic compound eye, comprising the electronic imaging device according to any items as mentioned above and a lens structure attached to the electronic imaging device, the lens structure is on a light incident surface side of the photosensitive units.

In some examples, the lens structure comprises a plurality of lenses, and the plurality of photosensitive units and the plurality of lenses are in one-to-one correspondence.

In some examples, the plurality of lenses at least comprise two lenses with different focal lengths.

In some examples, the lens structure and the base substrate are respectively on two sides of the photosensitive units.

Some embodiment of the disclosure provide a method of manufacturing an electronic imaging device, comprising: forming a semiconductor layer on a surface of a base substrate; forming a first conduction type doped region on a first predetermined region of the semiconductor layer, forming a second conduction type doped region and another second conduction type doped region on a second predetermined region and a third predetermined region of the conductor layer, respectively, the second predetermined region and the third predetermined region are respectively on two sides of the first predetermined region; wherein the first conduction type doped region and the second conduction type doped region form a photodiode, the first conduction type doped region and the another second conduction type doped region form a rectifier diode.

Some embodiments of the disclosure provides a method of manufacturing a flexible electronic compound eye, comprising: forming a plurality of photosensitive units arranged in an array on a predetermined substrate, each of the photosensitive units comprises a photodiode and a rectifier diode connected in series, and the first conduction type doped region of the photodiode and the first conduction type doped region of the rectifier diode are electrically connected to each other; and forming a flexible base substrate on the predetermined substrate where the photosensitive units are formed, and stripping the predetermined substrate after forming the flexible base substrate.

In some examples, the method further comprises: forming a lens structure on a light incident surface side of the photosensitive units.

In some examples, forming the lens structure on the light incident surface side of the photosensitive units comprising: forming prepolymer in a groove of a lens template, attaching the photosensitive units having the flexible base to a surface of the lens template to allow a position of the photosensitive units to correspond to that of the groove; and controlling the prepolymer to undergo polymerization to obtain a polymer lens.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

FIG. 21 schematically illustrates a flow chart of manufacturing a flexible electronic compound eye according to an exemplary embodiment of the present disclosure;

DETAILED DESCRIPTION

Figure 1:
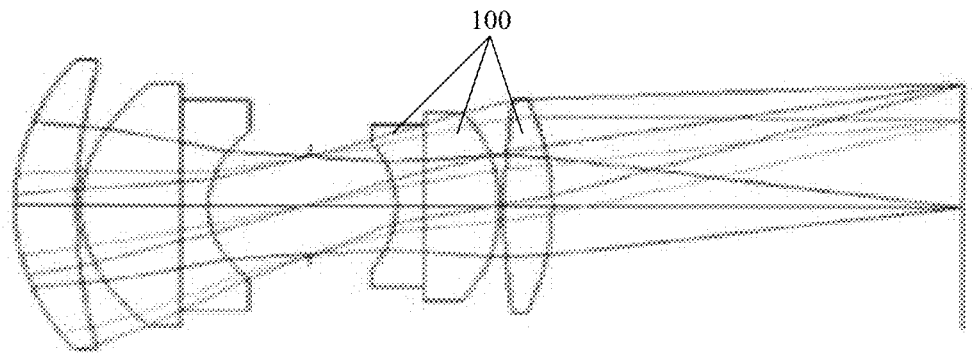
FIG. 1 schematically illustrates a schematic diagram of an optical path of an optical camera lens.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

In addition, the drawings are merely schematic representations of the present disclosure and are not necessarily to scale. The same reference numerals in the drawings denote the same or similar parts, and the repeated description thereof will be omitted. Some of the block diagrams shown in the figures are functional entities and do not necessarily have to correspond to physically or logically separated entities. These functional entities may be implemented in software, or implemented in one or more hardware modules or integrated circuits, or implemented in different network and/or processor devices and/or microcontroller devices.

FIG. 1 schematically illustrates a schematic diagram of an optical path of an optical camera lens. It can be seen that a structure with multilayer lenses 100 is disposed to realize focusing of the light, which is not only complicated, but also causes a large thickness and weight of the camera.

Figure 2:
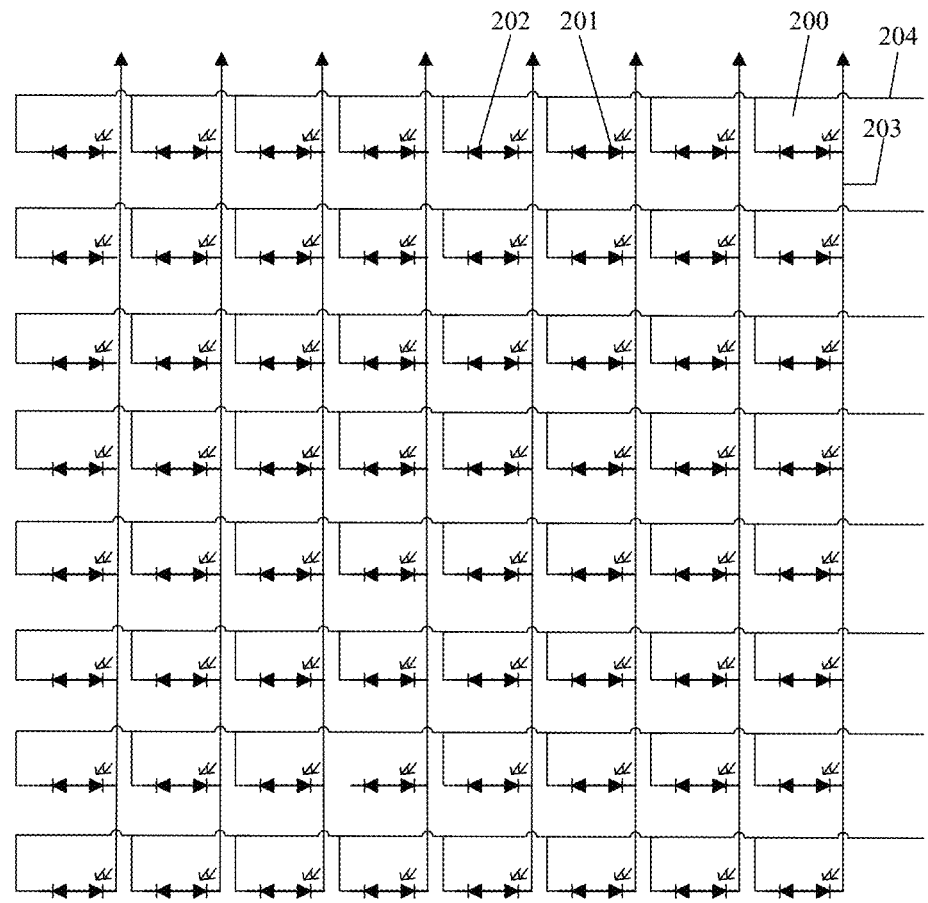
FIG. 2 schematically illustrates a schematic circuit diagram of an electronic imaging device according to an exemplary embodiment of the present disclosure.
Figure 3:
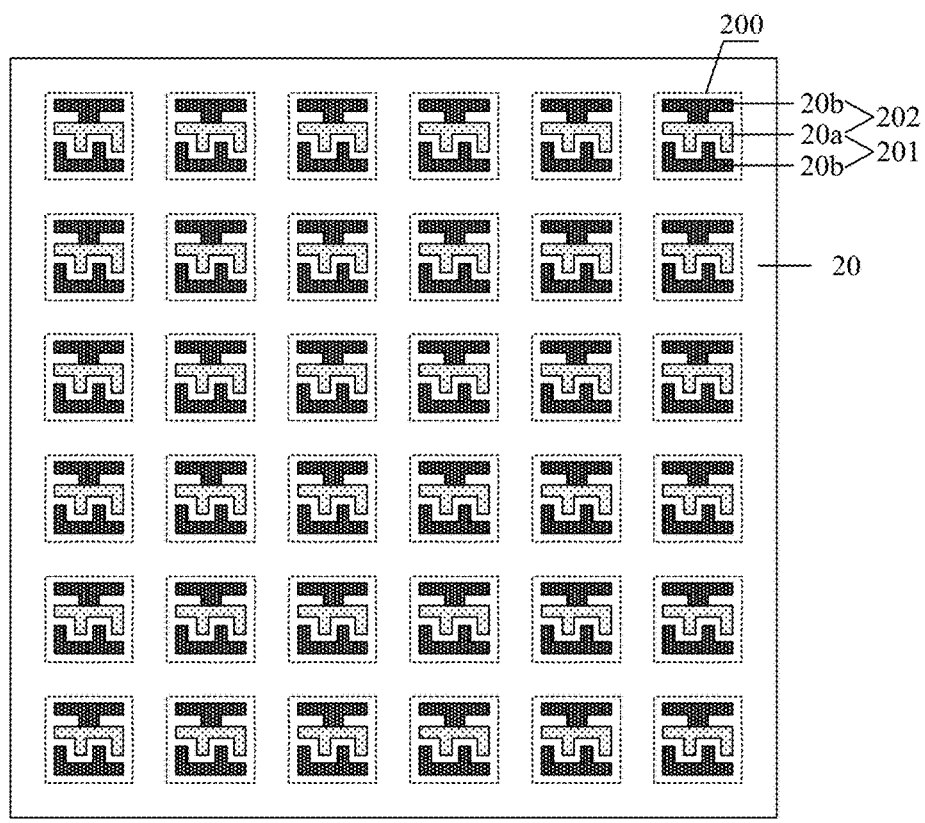
FIG. 3 schematically illustrates a schematic diagram of a pixel structure of an electronic imaging device according to an exemplary embodiment of the present disclosure.

Exemplary embodiments of the present disclosure provide an electronic imaging device that can be used in fields such as an electronic bionic compound eye. As shown in FIG. 2 and FIG. 3, the electronic imaging device can include a base substrate 20 and a plurality of photosensitive units 200 arranged in an array on a surface of the base substrate 20, each of the photosensitive units 200 can include a photodiode 201 and a rectifier diode 202 connected in series.

The photodiode 201 can include a first conduction type doped region 20a such as a p-doped region and a second conduction type doped region 20b such as a n-doped region, the rectifier diode 202 can also include the first conduction type doped region 20a such as the p-doped region and the second conduction type doped region 20b such as the n-doped region, and the photodiode 201 and the rectifier diode 202 can share a same first conduction type doped region 20a such as the p-doped region. It can be seen that the photodiode 201 and the rectifier diode 202 are connected reversely in a circuit structure.

It should be noted that when the electronic imaging device is in an operating state, the photodiode 201 can sense different light intensities to generate a photocurrent of a corresponding magnitude, thereby realizing a conversion of an optical signal to an electrical signal. For example, a voltage is applied on two sides of a photosensitive unit to reversely bias the photodiode 201 to detect the current generated by the photoelectric conversion. In addition, the photodiode 201 and the rectifier diode 202 sharing a p-doped region in the above-mentioned photosensitive unit is an example, and the p-doped region may also be separately provided for the photodiode 201 and the rectifier diode 202, as long as the p-doped region of the photodiode 201 and the p-doped region of the rectifier diode 202 are electrically connected to each other, the photodiode 201 and the rectifier diode 202 can be reversely connected. Therefore, the first conduction type doped region 20a of the photodiode and the first conduction type doped region 20a of the rectifier diode being electrically connected to each other herein includes at least the following two cases: 1) the photodiode and the rectifier diode respectively have respective first conduction type doped regions, but the two are electrically connected by contact or through other conductive members; 2) the photodiode and the rectifier diode share a same first conduction type doped region.

The electronic imaging device provided by exemplary embodiments of the present disclosure adopts a photosensitive structure arranged in an array. In one aspect, the electronic imaging device does not need to be provided with a plurality of layers of lenses, so that the structure of the device is simple and the device is light and thin. Compared with a traditional camera, the electronic imaging device can be built by using a plurality of low pixel wafer level cameras, the overall thickness can be reduced by 30~50%, and the thickness of the camera can be reduced from 6 mm to 3 mm. In another aspect, by providing the rectifier diode 202, signal leads can be multiplexed to reduce the complexity of the circuit. Moreover, the photodiode 201 and the rectifier diode 202 share a same first conduction type doped region 20a, which can further simplify the structure. In addition, each of the photosensitive units 200 can simultaneously acquire image data within a certain depth of field, and then adjust the focus. Moreover, full field depth image data is obtained during the imaging process, and thereby stereoscopic imaging within a certain range can also be achieved. For example, a plurality of photosensitive units can be respectively provided with a lens structure, and images of different depths of field can be obtained by different photosensitive units by setting lenses of different angles, thereby obtaining image data in different depths of field.

Since the electronic imaging device in this exemplary embodiment adopts a photosensitive structure arranged in an array, independent signal leads can be designed for each photosensitive unit 200. However, when the pixels of the electronic imaging device are further improved, the wiring difficulty of the independent signal leads is significantly increased, thus affecting the overall circuit structure of the electronic imaging device.

Based on this, referring to FIG. 2, the electronic imaging device can further include first signal leads 203 and second signal leads 204 interleaved with each other. The first signal leads 203 can be connected to an end of the photodiode 201 away from the rectifier diode 202, such as the n-doped region of the photodiode 201. The second signal leads 204 can be connected to an end of the rectifier diode 202 away from the photodiode 201, such as the n-doped region of the rectifier diode 202.

As such, the electronic imaging device can control a plurality of photosensitive units 200 in a same row through a same second signal lead 204, and control a plurality of photosensitive units 200 in a same row through a plurality of first signal leads 203, so that the individual control of photosensitive units 200 and the multiplexing of the signal leads are realized, and the number of the extraction electrodes for connecting the signal leads can be remarkably reduced, thereby achieving the effect of simplifying the circuit structure.

For example, the first signal leads 203 are electrically connected to the second conduction type doped region of the photodiode 201, the second signal leads are electrically connected to the second conduction type doped region of the rectifier diode 202.

For example, as illustrated in FIG. 2, a plurality of photosensitive units are arranged in an extending direction of the first signal leads 203 and an extending direction of the second signal leads 204, to form a plurality of photosensitive unit columns and a plurality of photosensitive unit rows. Each of the first signal leads 203 is connected to all of the photosensitive units in the corresponding photosensitive unit column, and each of the second signal leads 204 is connected to all of the photosensitive units in the corresponding photosensitive unit row.

In view of the fact that the electronic imaging device may be applied to a curved surface shape, such as a flexible electronic bionic compound eye structure, the base substrate 20 can be provided as a flexible base, and the material of the flexible base may be, for example, polydimethylsiloxane (PDMS). Since the tensile-resistant material does not necessarily have good high-temperature resistance, the performance exhibited in the high-temperature process may be poor, and thus the exemplary embodiments may employ such a tensile-resistant material such as PDMS as a base substrate and solve the defects of poor high temperature resistance by combining the transfer process. The details of the transfer process will be described in detail in the subsequent manufacturing methods. On the basis of this, the first signal leads 203 and the second signal leads 204 can be arranged in a spring-shaped conductive line manner or a nano-silver paste flexible conductive line manner, thereby facilitating stretching and bending of the signal leads.

Figure 4:
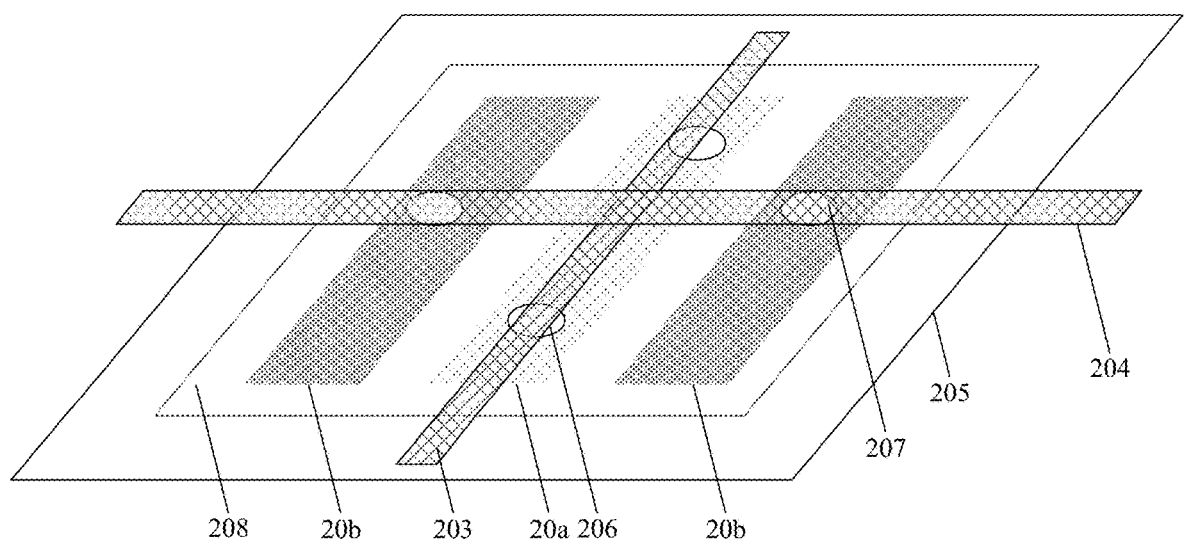
FIG. 4 schematically illustrates a schematic circuit diagram of a photosensitive unit according to an exemplary embodiment of the present disclosure.

FIG. 4 schematically illustrates a schematic circuit diagram of a photosensitive unit 200 that takes a flexible base as a substrate. An insulating layer 205 needs to be disposed between the first signal lead 203 such as the longitudinal lead and the second signal lead 204 such as the horizontal lead, and a transparent insulating layer 208 may also be disposed between the semiconductor pattern layer (i.e., the pattern layer where the photodiode 201 and the rectifier diode 202 located) and an adjacent signal lead such as the first signal lead 203. For a structure that does not need to be bent, the insulating layer 205 may be made of a passivation material such as silicon dioxide, silicon nitride or the like; and for a structure to be bent, the insulating layer 205 may be made of a material such as polyimide or the like. In addition, because the first signal lead 203 and the second signal lead 204 are both in different layers from the photodiode 201 and the rectifier diode 202, it is necessary to design a first via 206 and a second via 207 to respectively achieve conduction between the first signal lead 203 and the PN junction, and conduction between the second signal lead 204 and the PN junction.

Figure 5:
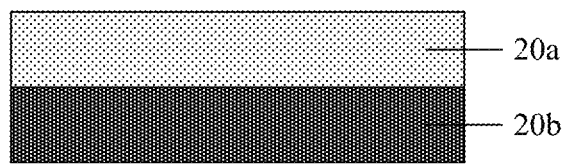
FIG. 5 schematically illustrates a schematic diagram of a shape of a PN junction of a photodiode according to an exemplary embodiment of the present disclosure.
Figure 6:
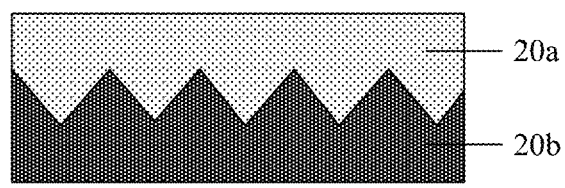
FIG. 6 schematically illustrates a schematic diagram of a shape of a PN junction of a photodiode according to an exemplary embodiment of the present disclosure.
Figure 7:
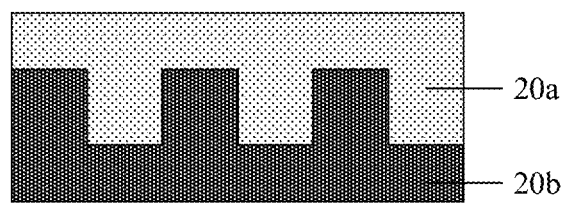
FIG. 7 schematically illustrates a schematic diagram of a shape of a PN junction of a photodiode according to an exemplary embodiment of the present disclosure.
Figure 8:
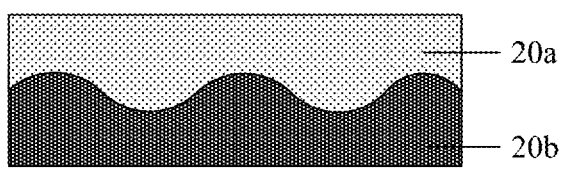
FIG. 8 schematically illustrates a schematic diagram of a shape of a PN junction of a photodiode according to an exemplary embodiment of the present disclosure.

In an embodiment of the present disclosure, as illustrated in FIG. 5 to FIG. 8, the photodiode 201 can include a PN junction composed of the first conduction type doped region 20a such as a p-doped region and the second conduction type doped region 20b such as a n-doped region. A shape of an interface between the first conduction type doped region 20a and the second conduction type doped region 20b can be set as, for example, a straight line shape as illustrated in FIG. 5, the fold line shapes as illustrated in FIG. 6 and FIG. 7, or a curved line shape as illustrated in FIG. 8.

It should be noted that: the present embodiment can adopt a PN junction interface of a straight line shape, which has relatively simple process control, but the light receiving area is limited. Therefore, the present embodiment can further adopt a PN junction interface of a non-straight line shape, such as a PN junction interface of a fold line shape or a curved line shape. For example, the fold line shape can include a fold line wave shape in FIG. 6 or a square wave shape in FIG. 7 and the like, the curved line shape can include, for example, a wave shape or a sinusoidal shape in FIG. 8 as long as it can increase the light receiving area, other details are not specifically limited. For example, the shape of the interface is seen in a view parallel to the substrate, so that the shape is shown as the shape of the above various lines. For example, by forming the surfaces of the p-doped region and the n-doped region of the PN junction facing each other into a complementary concavo-convex shape, the effective area of the PN junction can be increased, and the photoelectric conversion efficiency can be improved.

Figure 9:
FIG. 9 schematically illustrates a schematic diagram of a shape of a PIN junction of a photodiode according to an exemplary embodiment of the present disclosure.
Figure 10:
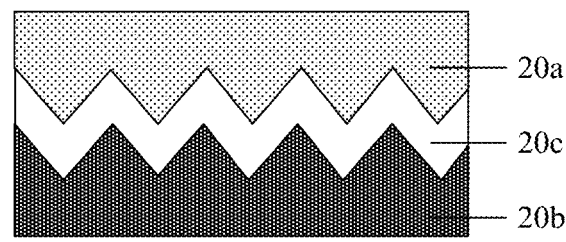
FIG. 10 schematically illustrates a schematic diagram of a shape of a PIN junction of a photodiode according to an exemplary embodiment of the present disclosure.
Figure 11:
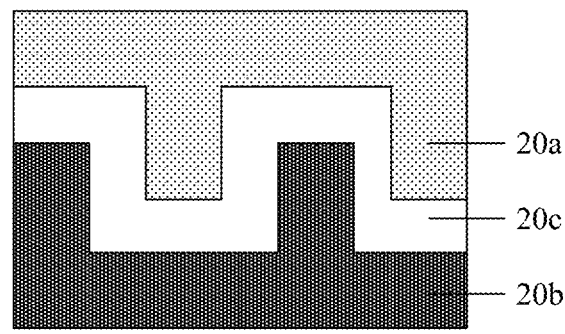
FIG. 11 schematically illustrates a schematic diagram of a shape of a PIN junction of a photodiode according to an exemplary embodiment of the present disclosure.
Figure 12:
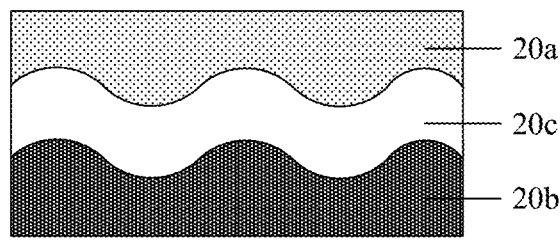
FIG. 12 schematically illustrates a schematic diagram of a shape of a PIN junction of a photodiode according to an exemplary embodiment of the present disclosure.
Figure 13:
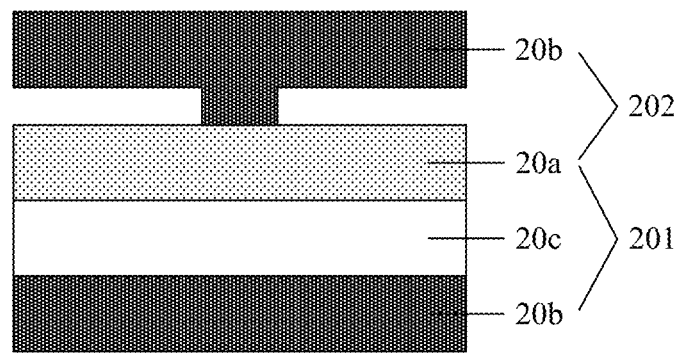
FIG. 13 schematically illustrates a schematic diagram of a shape of a photosensitive unit according to an exemplary embodiment of the present disclosure.
Figure 14:
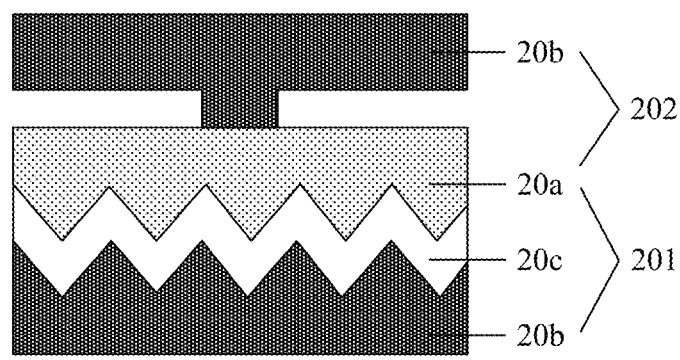
FIG. 14 schematically illustrates a schematic diagram of a shape of a photosensitive unit according to an exemplary embodiment of the present disclosure.
Figure 15:
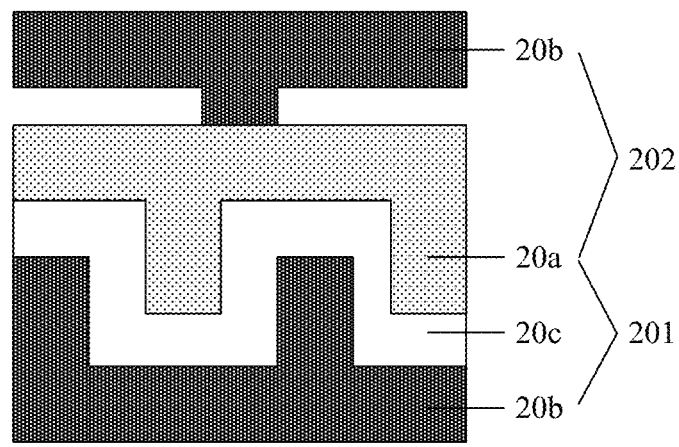
FIG. 15 schematically illustrates a schematic diagram of a shape of a photosensitive unit according to an exemplary embodiment of the present disclosure.
Figure 16:
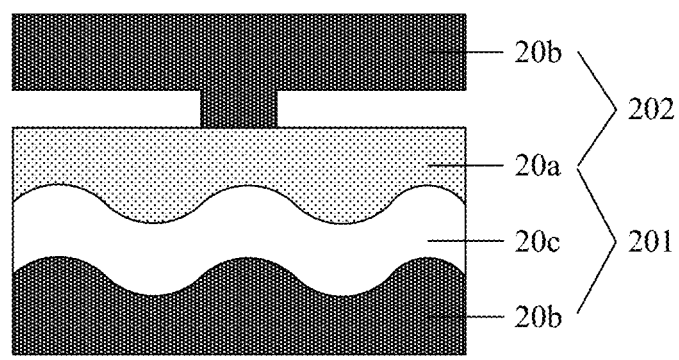
FIG. 16 schematically illustrates a schematic diagram of a shape of a photosensitive unit according to an exemplary embodiment of the present disclosure.

In another embodiment of the present disclosure, as illustrated in FIG. 9 to FIG. 12, the photodiode 201 can further include a PIN-junction composed of the first conduction type doped region 20a such as the p-doped region, the second conduction type doped region 20b such as the n-doped region and a undoped region 20c such as an i region located therebetween. Because the PIN junction can obtain a larger response at a certain photosensitive wavelength than the PN junction, the response frequency of the PIN junction is larger than that of the PN junction. The shape of the undoped region 20c can be set as, for example, a straight line shape as illustrated in FIG. 9, a fold line shape as illustrated in FIG. 10 and FIG. 11 or a curved line shape as illustrated in FIG. 12.

It should be noted that: the present embodiment can adopt an undoped region 20c of a straight line shape, which has relatively simple process control, but the light receiving area is limited. Therefore, the present embodiment can further adopt an undoped region 20c of a non-straight line shape, such as an undoped region 20c of a fold line shape or a curved line shape. For example, the fold line shape can include a fold line wave shape in FIG. 10 or a square wave shape in FIG. 11 and the like, the curved line shape can include, for example, a wave shape or a sinusoidal shape in FIG. 12 as long as it can increase the light receiving area, other details are not specifically limited.

Based on the shape of the above photodiode 201, as illustrated in FIG. 13 to FIG. 16, when rectifier diode 202 is disposed, it is only necessary to form the second conduction type doped region 20b such as the n-doped region on the other side of the first conduction type doped region 20a of the photodiode 201, such as the p-doped region, that is, the side of the first conduction type doped region 20a away from the second conduction type doped region 20b such as the n-doped region. At this time, the rectifier diode 202 and the photodiode 201 obtained share the first conduction type doped region 20a.

Figure 17:
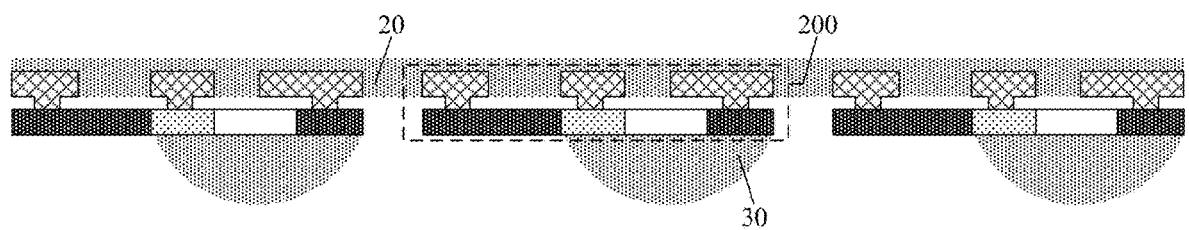
FIG. 17 schematically illustrates a schematic diagram of a structure of a flexible electronic compound eye according to an exemplary embodiment of the present disclosure.

Based on the above electronic imaging device, in order to better imitate a biological compound eye structure, as illustrated in FIG. 17, the exemplary embodiment further provides a flexible electronic compound eye. The flexible electronic compound eye includes the above electronic imaging device and a polymer lens 30 attached to the electronic imaging device, the base substrate 20 of the electronic imaging device is a flexible base substrate, the polymer lens 30 and the flexible base substrate are respectively at two sides of the photosensitive unit 200 of the electronic imaging device. For example, the lens structure 30 can be disposed at a light incident surface side of the photosensitive units. It can be seen that, a surface of each photosensitive unit 200 is covered with a polymer lens 30, which is designed to expand the view angle of the compound eye and to increase the light-sensing range when forming a curved interface. For example, the lens structure 30 includes a plurality of lenses, the plurality of photosensitive units and the plurality of lenses are in one to one correspondence. In addition, the lens structure is disposed at the light incident surface side of the photosensitive units, so that each lens is capable of guiding image light to a corresponding photosensitive unit to obtain image data by photoelectric conversion. For example, the plurality of lenses at least include two lenses having different focal lengths, for example, including a plurality of lenses having different focal lengths, thereby the plurality of photosensitive units can take images of a plurality of different depth of field ranges.

Figure 18:
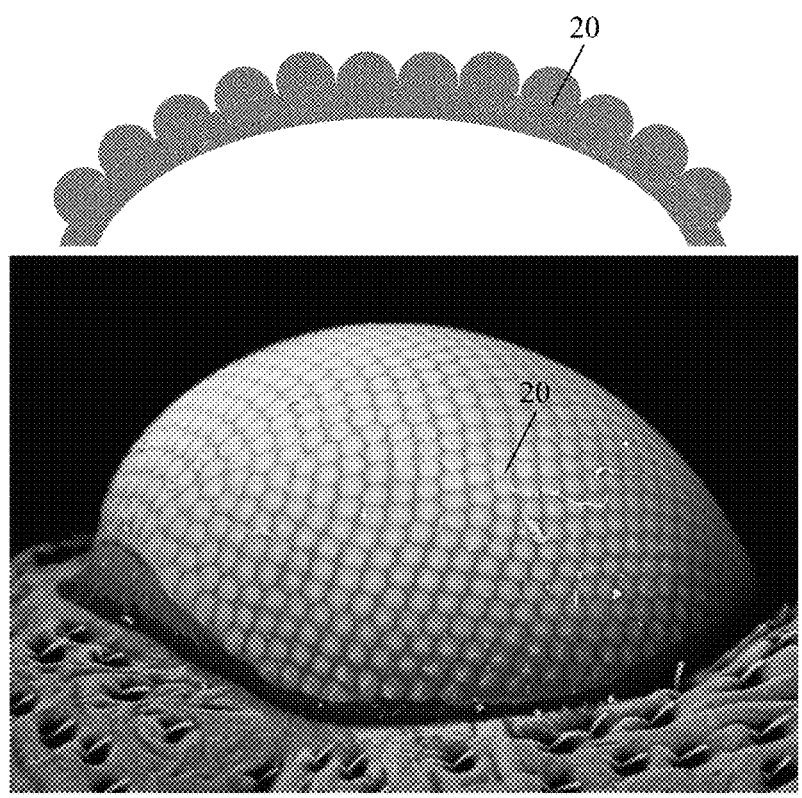
FIG. 18 schematically illustrates a schematic diagram of an application of a flexible electronic compound eye according to an exemplary embodiment of the present disclosure.

FIG. 18 illustrates a schematic diagram of an application of the flexible electronic compound eye. Because the flexible electronic compound eye uses a flexible base and a stretchable lead, it has good tensile properties and deformability, and is capable of achieving adaptive fit according to surfaces having different curvatures. For example, the flexible electronic compound eye can further be bent to accommodate different surface shapes of a supporting object, so that different photosensitive units in the flexible electronic compound eye can take image light from different angles.

The flexible electronic compound eye structure provided by schematic embodiments of the present disclosure can obtain a bionic compound eye structure having an adaptive function by forming a photosensitive array on the surface of the flexible base substrate and attaching the polymer lenses 30 over the photosensitive array. The flexible electronic compound eye can completely collect image data within a certain depth of field range, thereby ensuring the function of focusing after image collection. Because the flexible electronic compound eye collects full field depth image data during the imaging process, stereoscopic imaging can be realized within a certain range, and the thus obtained photo can be directly restored to a 3D effect. It is also possible to directly measure the distance, thus providing great convenience to the user. In addition, because the photosensitive array structure is integrated in the flexible electronic compound eye, each photosensitive unit 200 can respectively record imaging information and directly output information.

Figure 19:
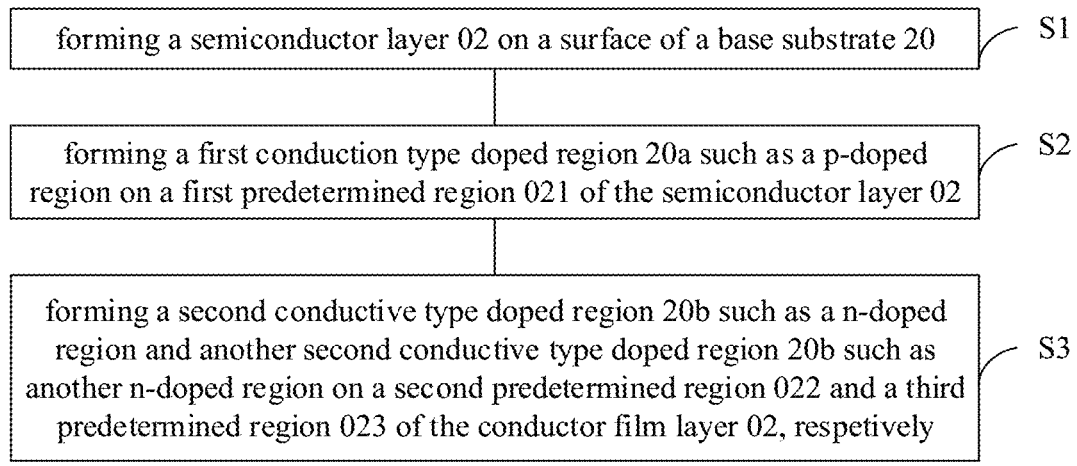
FIG. 19 schematically illustrates a flow chart of manufacturing an electronic imaging device according to an exemplary embodiment of the present disclosure.

The exemplary embodiment further provides a method of manufacturing an electronic imaging device, which can be used to manufacture the above electronic imaging device. As illustrated in FIG. 19, the method of manufacturing an electronic imaging device can include:

S1, forming a semiconductor layer 02 on a surface of a base substrate 20;

S2, forming a first conduction type doped region 20a such as a p-doped region on a first predetermined region 021 of the semiconductor layer 02;

S3, forming a second conduction type doped region 20b such as a n-doped region and another second conduction type doped region 20b such as another n-doped region on a second predetermined region 022 and a third predetermined region 023 of the conductor layer 02, respectively.

The second predetermined region 022 and the third predetermined region 023 are respectively on two sides of the first predetermined region 021. The first conduction type doped region 20a of the first predetermined region 021 and the second conduction type doped region 20b of the second predetermined region 022 can form the photodiode 201, and the first conduction type doped region 20a of the first predetermined region 021 and the another second conduction type doped region 20b of the third predetermined region 023 can form the rectifier diode 202.

For the method of manufacturing the electronic imaging device provided by the exemplary embodiments of the present disclosure, in one aspect, the electronic imaging device can be manufactured by the thin film transistor (TFT) array substrate manufacturing process which is already mature, so that the reusability of the manufacturing device is good; in another aspect, the multiplexing of the signal leads can be achieved by providing the rectifier diode 202, so that the complexity of the circuit can be reduced, and the photodiode 201 and the rectifier diode 202 share a same first conduction type doped region 20a, which can further simplify the structure; in yet another aspect, there is no need to provide a plurality of layers of lenses, so that the structure is simple and the device is light and thin.

The process of the photosensitive unit 200 will be exemplarily described below with reference to FIG. 20. First, a semiconductor layer 02 such as a silicon film having a thickness of 200 to 600 nm is deposited on a surface of the base substrate 20; then photoresist 40 is applied on the surface of the semiconductor layer 02, and the position of the semiconductor layer 02 corresponding the first predetermined region 021 is exposed by exposure and development; then p-doping is performed on the first predetermined region 021 to obtain a first conduction type doped region 20a, i.e., a p-doped region, and then the remaining photoresist 40 is stripped off; then the photoresist 40 is applied on the surface of the semiconductor layer 02 again, and the position of the semiconductor layer 02 corresponding the second predetermined region 022 and the third predetermined region 023 is exposed by exposure and development; then n-doping is performed on the second predetermined region 022 and the third predetermined region 023 to form a second conduction type doped region 20b such as a n-doped region and another second conduction type doped region 20b such as another n-doped region, and then the remaining photoresist 40 is stripped off; subsequently, the photoresist 40 is further applied on the surface of the semiconductor layer 02, and the portion of the semiconductor layer 02 that does need to form a PN junction or a PIN junction is exposed by exposure and development, that is, exposure and development is performed according to the matrix shape required for dual diodes; finally, the exposed portion of the semiconductor layer 02 is removed by an etching process to obtain a photosensitive unit 200 composed of the photodiode 201 and the rectifier diode 202.

Figure 22:
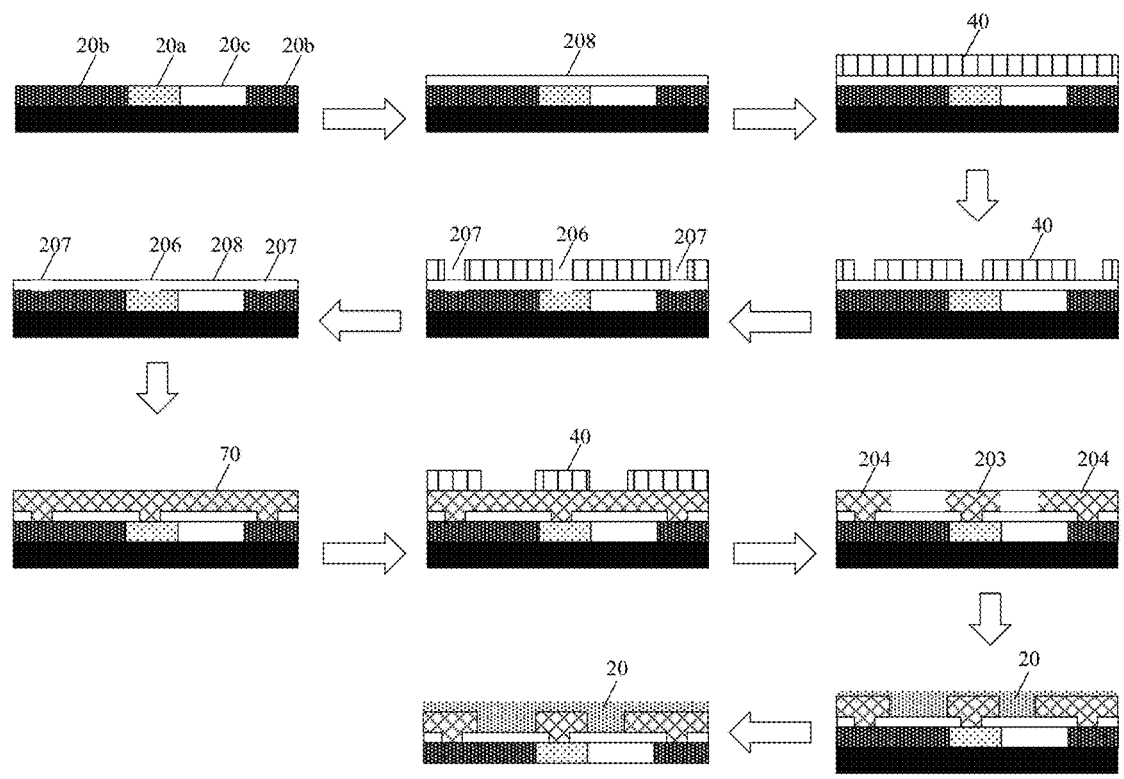
FIG. 22 schematically illustrates a schematic diagram of a process of manufacturing a flexible photosensitive unit according to an exemplary embodiment of the present disclosure.
Figure 23:
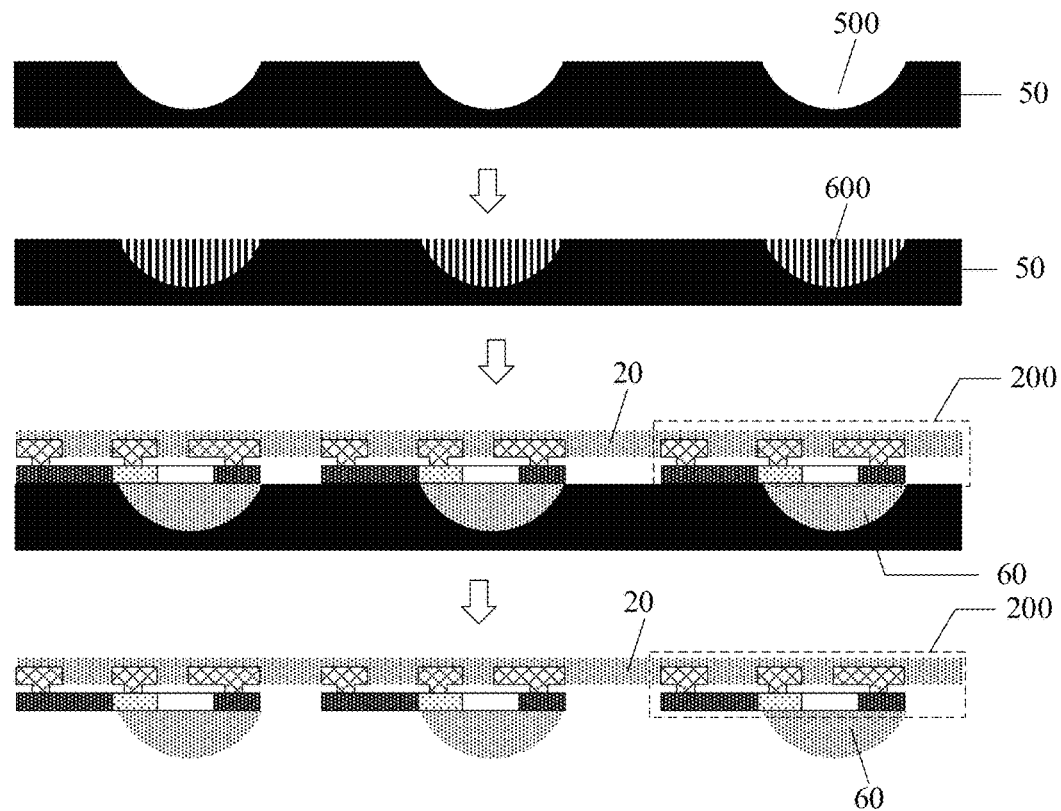
FIG. 23 schematically illustrates a schematic diagram of a process of manufacturing a flexible electronic compound eye according to a schematic embodiment of the present disclosure.

The exemplary embodiment further provides a method of manufacturing a flexible electronic compound eye, which can be used to manufacture the above flexible electronic compound eye. As illustrated in FIG. 21, the method of manufacturing a flexible electronic compound eye can include:

S10, as illustrated in FIG. 22, forming a plurality of photosensitive units 200 on a predetermined substrate in an array, each photosensitive unit 200 can include a photodiode 201 and a rectifier diode 202 connected in series, and the photodiode 201 and the rectifier diode 202 share a same first conduction type doped region 20a such as a p-doped region;

S20, as illustrated in FIG. 22, forming a flexible base, i.e., a base substrate 20 of a flexible material on a predetermined substrate where the photosensitive units 200 are formed, and stripping the predetermined substrate after forming the flexible base;

S30, as illustrated in FIG. 23, forming prepolymers 600 in a groove 500 of a lens template 50, attaching the photosensitive units 200 having the flexible base to a surface of the lens template 50 to allow a position of the photosensitive unit 200 to correspond to that of the groove 500;

S40, as illustrated in FIG. 23, controlling the prepolymers 600 to undergo polymerization to obtain a polymer lens 60, and performing a demolding process after the polymer lens 60 is formed, the flexible base and the polymer lens 60 being respectively located on both sides of the photosensitive unit 200.

It should be noted that: the predetermined substrate refers to a carrier substrate used in manufacturing a flexible device, which needs to be removed by a stripping process after the flexible device is manufactured; the lens template 50 refers to a shape template used in manufacturing the polymer lens 60, which usually needs to be removed by a demolding process after the polymer lens 60 is manufactured.

Figure 20:
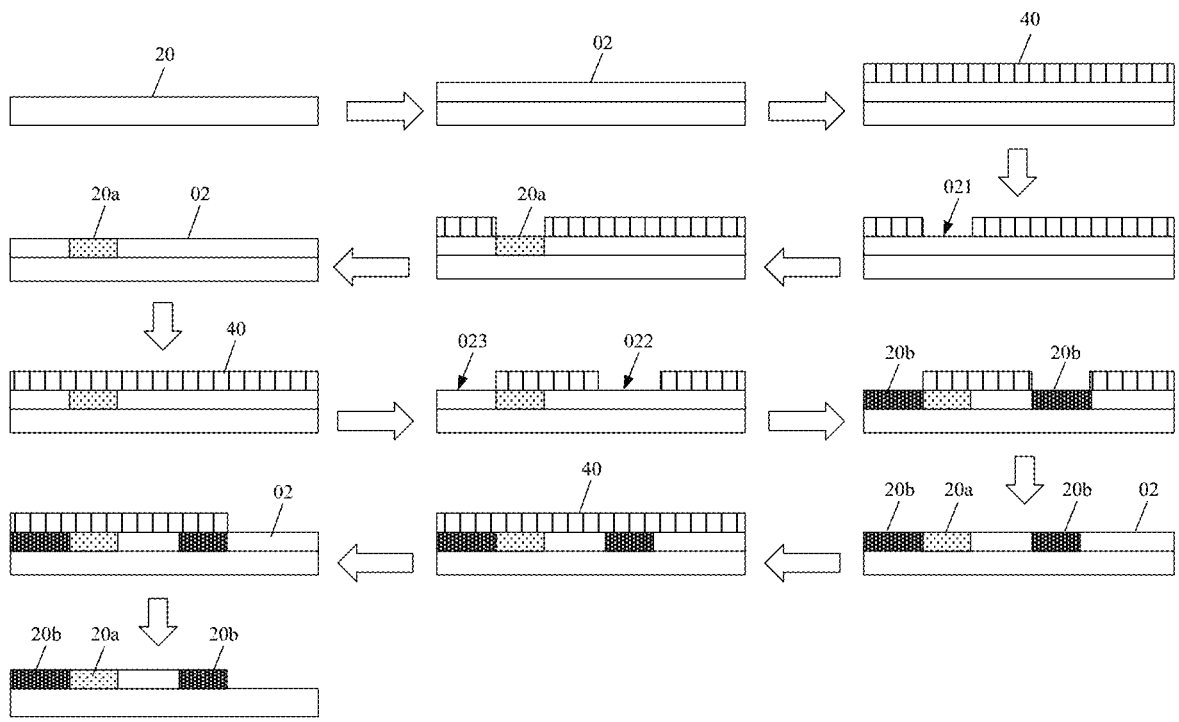
FIG. 20 schematically illustrates a schematic diagram of a process of manufacturing an electronic imaging device according to an exemplary embodiment of the present disclosure.

For example, for the steps of manufacturing the photosensitive unit, the manufacturing method described in embodiments of FIG. 19 and FIG. 20 can be utilized, and then the photosensitive unit array is transferred to the flexible base. However, embodiments of the present disclosure are not limited thereto. In addition, the method of manufacturing the lens structure in FIG. 23 is also exemplary, and embodiments of the present disclosure can also adopt other methods to manufacture the lens structure, and then attach the lens structure to the light incident surface side of the photosensitive unit.

The method of manufacturing a flexible electronic compound eye provided by exemplary embodiments of the present disclosure can be manufactured by the TFT array substrate manufacturing process which is already mature. By forming a photosensitive array on the surface of the flexible base and attaching the polymer lens 30 over the photosensitive array, a bionic compound eye structure having an adaptive function can be obtained. The design of the lens structure helps to expand the view angle of the compound eye and to increase the light-sensing range when forming a curved interface.

The process of the portion of the photosensitive unit 200 in the flexible electronic compound eye will be exemplarily described below with reference to FIG. 22. First, polyimide (PI) is applied on the surface of the photosensitive unit 200 as a transparent insulating layer 208, and photoresist 40 is applied on the transparent insulating layer 208, and the positions of a first via 206 and a second via 207 is obtained by exposure and development, and then the desired via structure is formed by etching the portion region of the transparent insulating layer 208 corresponding to the first via 206 and the second via 207; then the remaining photoresist 40 is stripped off and an electrode layer 70 is deposited. By structurally designing the electrode layer 70, for example, through the applying, exposure and development of the photoresist 40 and the etching processes, signal leads respectively connecting different doped regions can be obtained. Finally, dimethylsiloxane is applied on the signal leads and polymerized to form a flexible substrate, thereby obtaining an array structure of the photosensitive units 200 on the flexible substrate.

It should be noted that although several modules or units of equipment for action execution are mentioned in the detailed description above, such division is not mandatory. Indeed, in accordance with embodiments of the present disclosure, the features and functions of two or more modules or units described above may be embodied in one module or unit. Conversely, the features and functions of one of the modules or units described above may be further embodied by a plurality of modules or units.

In addition, although the various steps of the method of the present disclosure are described in a particular order in the drawings, this is not required or implied that the steps must be performed in the specific order, or all the steps shown must be performed to achieve the desired result. Additionally or alternatively, certain steps may be omitted, a plurality of steps are performed by being combined into one step, and/or one step is performed by being decomposed into a plurality of steps and the like.

The foregoing is merely exemplary embodiments of the present disclosure, but is not used to limit the protection scope of the present disclosure. The protection scope of the present disclosure shall be defined by the attached claims.

The invention claimed is:

1. An electronic imaging device, comprising a base substrate and a plurality of photosensitive units arranged in an array on a surface of the base substrate, at least one of the photosensitive units comprises a photodiode and a rectifier diode connected in series, wherein the photodiode comprises a first conduction type doped region and a second conduction type doped region, the rectifier diode comprises another first conduction type doped region and another second conduction type doped region, and the first conduction type doped region of the photodiode and the first conduction type doped region of the rectifier diode are electrically connected to each other, a shape of a side of the first conduction type doped region facing the second conduction type doped region and a shape of a side of the second conduction type doped region facing the first conduction type doped region comprise a fold line shape, the fold line shape comprises a zigzag shape, and the fold line shape at least comprises a first portion and a second portion connected with each other, with the first portion and second portion extending to different directions respectively.

2. The electronic imaging device according to claim 1, wherein the photodiode and the rectifier diode share a same first conduction type doped region.

3. The electronic imaging device according to claim 1, wherein the first conduction type doped region is a p-doped region.

4. The electronic imaging device according to any one of claim 1, wherein the photodiode comprises a PN junction composed of the first conduction type doped region and the second conduction type doped region.

5. The electronic imaging device according to claim 1, wherein the photodiode comprises a PIN junction composed of the first conduction type doped region, the second conduction type doped region and a non-doped region between the first conduction type doped region and the second conduction type doped region, a shape of the non-doped region comprises the fold line shape.

6. The electronic imaging device according to claim 1, wherein the electronic imaging device further comprises first signal leads and second signal leads interleaved with each other, the first signal leads are connected to an end of the photodiode away from the rectifier diode, and the second signal leads are connected to an end of the rectifier diode away from the photodiode.

7. The electronic imaging device according to claim 6, wherein the first signal leads are electrically connected to the second conduction type doped region of the photodiode, the second signal leads are electrically connected to the second conduction type doped region of the rectifier diode.

8. The electronic imaging device according to claim 6, wherein the plurality of photosensitive units are arranged in an extension direction of the first signal leads and an extension direction of the second signal leads, to form a plurality of photosensitive unit columns and a plurality of photosensitive unit rows, each of the first signal leads is connected to all the photosensitive units of a corresponding photosensitive unit column, and each of the second signal leads is connected to all the photosensitive units of a corresponding photosensitive unit row.

9. The electronic imaging device according to claim 6, wherein the first signal leads comprise a flexible conductive line, and the second signal leads comprise a flexible conductive line.

10. The electronic imaging device according to claim 9, wherein the first signal leads comprise a spring-shaped conductive line or a nano-silver conductive line, the second signal leads comprise another spring-shaped conductive line or another nano-silver paste conductive line.

11. The electronic imaging device according to claim 1, wherein the base substrate is a flexible base substrate.

12. A flexible electronic compound eye camera, comprising the electronic imaging device according to claim 1 and a lens structure attached to the electronic imaging device, wherein the base substrate is a flexible base substrate and the lens structure is on a light incident surface side of the photosensitive units.

13. The flexible electronic compound eye camera according to claim 12, wherein the lens structure comprises a plurality of lenses, and the plurality of photosensitive units and the plurality of lenses are in one-to-one correspondence.

14. The flexible electronic compound eye camera according to claim 13, wherein the plurality of lenses at least comprise two lenses with different focal lengths.

15. The flexible electronic compound eye camera according to claim 12, wherein the lens structure and the base substrate are respectively on two sides of the photosensitive units.

16. An electronic imaging device, comprising a base substrate and a plurality of photosensitive units arranged in an array on a surface of the base substrate, at least one of the photosensitive units comprises a photodiode and a rectifier diode connected in series, wherein the photodiode comprises a first conduction type doped region and a second conduction type doped region, the rectifier diode comprises another first conduction type doped region and another second conduction type doped region, and the first conduction type doped region of the photodiode and the first conduction type doped region of the rectifier diode are electrically connected to each other, a shape of a side of the first conduction type doped region facing the second conduction type doped region and a shape of a side of the second conduction type doped region facing the first conduction type doped region comprise a fold line shape, the fold line shape comprises a square wave shape, and the fold line shape at least comprises a first portion and a second portion connected with each other, with the first portion and second portion extending to different directions respectively.

\* \* \* \* \*